United States Patent [19]
Lee

[11] Patent Number: 5,260,593
[45] Date of Patent: Nov. 9, 1993

[54] SEMICONDUCTOR FLOATING GATE DEVICE HAVING IMPROVED CHANNEL-FLOATING GATE INTERACTION

[75] Inventor: Roger R. Lee, Boise, Id.

[73] Assignee: Micron Technology, Inc., Boise, Id.

[21] Appl. No.: 805,298

[22] Filed: Dec. 10, 1991

[51] Int. Cl.$^5$ .................. H01L 29/68; G11C 11/34
[52] U.S. Cl. ...................... 257/316; 257/322; 257/402; 365/185
[58] Field of Search .............. 257/315, 316, 322, 402; 365/185

[56] References Cited

U.S. PATENT DOCUMENTS

| | | | |
|---|---|---|---|
| 4,745,079 | 5/1988 | Pfiester | 257/316 |
| 4,794,433 | 12/1988 | Kamiya et al. | 257/321 |
| 4,816,883 | 3/1989 | Baldi | 257/322 |

OTHER PUBLICATIONS

"Physics of Semiconductor Devices", 1981, by John Wiley & Sons, Inc. by S. M. Sze, ISBN 0-471-05661-8.

Primary Examiner—Rolf Hille
Assistant Examiner—Robert Limanek
Attorney, Agent, or Firm—Stanley N. Protigal

[57] ABSTRACT

Described is an E$^2$PROM design comprising a channel region and a floating gate comprising P-type polycrystalline silicon. The work function difference between P-type material effectively increases the threshold voltage of the transistor. This alleviates the need for a boron $V_T$ adjust implant. Implants of material such as boron to set the threshold voltage are known to correlate with problems such as implant ionization and junction (avalanche) breakdown. These two undesired effects can be decreased or eliminated in devices comprising the invention. An optional phosphorous implant into the substrate would allow the lowering of $V_T$ to a desired level.

11 Claims, 2 Drawing Sheets

SEMICONDUCTOR FLOATING GATE DEVICE HAVING IMPROVED CHANNEL-FLOATING GATE INTERACTION

FIELD OF THE INVENTION

This invention relates to the field of semiconductor devices. More specifically, a cell structure for Electrically Erasable Programmable Read-Only Memories (E²PROM) is described which has increased resistivity to impact ionization and junction (avalanche) breakdown due to an interaction between its P-type floating gate and its P-type substrate. The inventive structure is especially useful in the manufacture of Flash E²PROMs.

BACKGROUND OF THE INVENTION

Erasable Programmable Read-only Memories (EPROMs), Electrically Erasable Programmable Read-only Memories (E²PROMs), and Flash E²PROMs (hereafter collectively, PROMs) have several structures which allow them to hold a charge without refresh for extended periods of time. FIG. 1 shows a top view of a PROM array, FIG. 2 shows a cross section along "AA" of FIG. 1, and FIG. 3 shows a cross section along "BB" of FIG. 1. The charge itself is stored on a "floating gate" 10 also referred to as Poly 1 or P1, which is a structure of polycrystalline silicon (hereafter, poly) surrounded on all sides by a layer of oxide 12. Located superjacent and parallel to this P1 structure is another poly structure, the "control gate" 14 or P2. P1 10 and P2 14 act as the two plates of a capacitor. Below the P1 layer are two N+ junctions, one which acts as the transistor source 16 and the other as the drain 18, which are doped into a P-type substrate 20. The portion of the substrate 20 between the source 16 and the drain 18 is the channel 22. The cell functions like an enhancement-type N-channel metal oxide semiconductor field effect transistor (MOSFET) with two gates of poly.

There are many ways to program a PROM. In one technique, a potential such as 12 V, for example, is applied on the control gate. Simultaneously, a voltage pulse, for example 8 V, is applied between source and drain. The large positive voltage on the control gate establishes an electric field in the insulating oxide. This electric field attracts the electrons generated from the so-called "avalanche breakdown" of the transistor due to the high drain and control gate voltages, and accelerates them toward the floating gate, which they enter through the oxide. In this way the floating gate is charged, and the charge that accumulates on it becomes trapped.

To return the floating gate from a charged state to a state with no charge, the electrons are caused to return to the substrate. In an EPROM, this is accomplished with ultraviolet light which excites the electrons past a certain energy state, thereby allowing them to pass through the oxide and return to the substrate. In an E²PROM, this excitation is accomplished with an electrical field.

There are structures that make up a PROM array which are common to several transistors in the array. FIG. 1 is a top view of an array showing the transistor sources 16, drains 18, digit lines 24, floating gates 10, and control or "word" lines 26 which form control gates 14 as they pass over the floating gates 10. Also shown as a dotted line is the "active area" 28 interspersed with areas of field oxide 30. A single word line 26 is common to all transistors in a single column acting as a control gate 14 for all transistors in the column. When the word line is selected it activates all transistors in the column. The source regions 16, which run parallel with the control lines 26, are common to all transistors in two adjacent columns. Individual transistor drains 18 are common to two transistors in adjacent columns. The digit (or bit) lines 24 are common with the drains 18 of all transistors in a single row.

To read the datum stored on a floating gate 10, the control line 26 of the cell to be read is activated, for example by bringing it to between 2.5 V and 3.5 V which causes all transistors in the selected column to become active. This voltage applied to the control gate 26 is above the trip voltage of a cell holding a "1" state, and below the trip voltage of a cell storing a "0". The voltage needed on the transistor channel to trip the transistor, the "threshold voltage" ($V_T$) is set to a known voltage, for instance 1 V. If a cell is set to a zero, arbitrarily defined by storing $-3$ V on the floating gate 10, and 3.5 V is applied to the control gate, the net effect on the transistor channel is less than the 1 V needed to trip the transistor. If a cell is set to a one, arbitrarily defined by storing 0 V on the floating gate 10, the net effect on the transistor channel is greater than the 1 V needed to activate the transistor. After the control gate 26 is activated, each cell along that control gate 26 outputs the cell information on their respective digit lines 24, either an OFF if the floating gate is storing a charge or an ON if the cell is not storing a charge. The information on the digit line 24 which corresponds to the cell to be read is obtained with a sense amplifier (not shown), with one sense amp for each digit line.

In a conventional Flash E²PROM cell, the floating gate and the control gate are both manufactured from N-type poly. The substrate is P-type conductivity with N+ junctions which form the source and drain regions. To manufacture N-type poly, a poly structure is doped with atoms having more than four valence electrons (group V or higher), such as arsenic or phosphorus, which introduces negatively charged majority carriers into the silicon and make the semiconductive material somewhat more conductive. To manufacture P-type poly, a poly structure is doped with atoms having less than four valence electrons (group III or lower), such as boron, which introduce positively charged majority carriers and make the semiconductive material somewhat less conductive. The majority charge carrier type is also referred to as conductivity type.

The threshold voltage on a conventional PROM device is set to a desired voltage by performing a "$V_T$ adjust implant" which is a standard enhancement implant. If no $V_T$ adjust implant is performed, the transistor will trip at too low a voltage, for instance 0 V. This would cause the transistor to trip when it should not, thereby indicating that the floating gate is storing a charge when it actually is not. Implanting boron into the substrate makes the semiconductor material less likely to invert thereby increasing the trip voltage to, for instance, 1 V.

During this $V_T$ adjust implant a material, usually boron, is implanted through the gate oxide into the substrate before the P1 and P2 layers are formed. This implant permeates all substrate areas covered by the thin gate oxide, which includes what will become the transistor channel areas, and increases the P-type doping concentration and therefore increases the threshold voltage.

A Flash E²PROM cell has various problems which can occur during the erase of a charge on the floating gate, problems which result from the boron implant to adjust the threshold voltage. The problems increase as the level of boron in the substrate (specifically in the channel region of the transistor) is increased, and decrease as the level of boron decreases.

A first problem, impact ionization, occurs as the voltage potential across the source and the control gate increases. During an erase, the control gate is held at a low voltage, for instance 0 V, while a high voltage, for example 15 V, is applied to the source region. During impact ionization, the floating gate and source are "shorted" which causes an uncontrolled erasure of the floating gate, and therefore an overerase (i.e. depletion mode) of the floating gate can occur. While the mechanism is not known, it is believed that either the electrons tunnel through the thin gate oxide to the source, or that holes are transferred to the floating gate. The charges on the other floating gates on the device erase at a normal rate, and therefore an uneven erase occurs over the transistor array.

A second problem which can occur is junction breakdown, also referred to as avalanche breakdown. This occurs when the current from the source disperses into the grounded substrate. Normally, an electric field results from the 0 V on the control gate and the 15 V on the source, thereby allowing the charge stored on the floating gate to tunnel to the source. If the junction breakdown occurs at 14 V, for instance, the voltage on the source can never reach 15 V and the charge on the floating gate cannot be erased.

A PROM design which protects against the undesired phenomena of impact ionization and junction breakdown resulting from a $V_T$ adjust implant of boron or other positively charged majority carriers as listed above would be a desireable structure.

SUMMARY OF THE INVENTION

An object of the invention is to provide a PROM device which does not require a $V_T$ adjust implant of positively charged majority carriers.

Another object of the invention is to provide a PROM device which has more uniform erase characteristics across all transistors in the Flash E²PROM array.

Another object of the invention is to provide a PROM device which has a reduced possibility of impact ionization during erase.

Still another object of the invention is to provide a PROM device which has a reduced possibility of avalanche breakdown during erase.

Yet another object of the invention is to provide a PROM device which has a higher yield due to fewer devices having problems with impact ionization and avalanche breakdown.

These objects of the invention are realized through a PROM design which uses a conventional P-type substrate and an inventive P1 structure having a P-type conductivity instead of the conventional N-type. The source and drain conductivity types would follow teachings in the art, as would the conductivity of the control gate (word line). As a result of the channel region and the floating gate having the same conductivity types, the threshold voltage of the transistor is increased without performing a $V_T$ adjust implant of boron or other similar material to the substrate. This results from the work function difference between the structures both having a P-type conductivity.

DETAILED DESCRIPTION OF THE INVENTION

Figure 1:
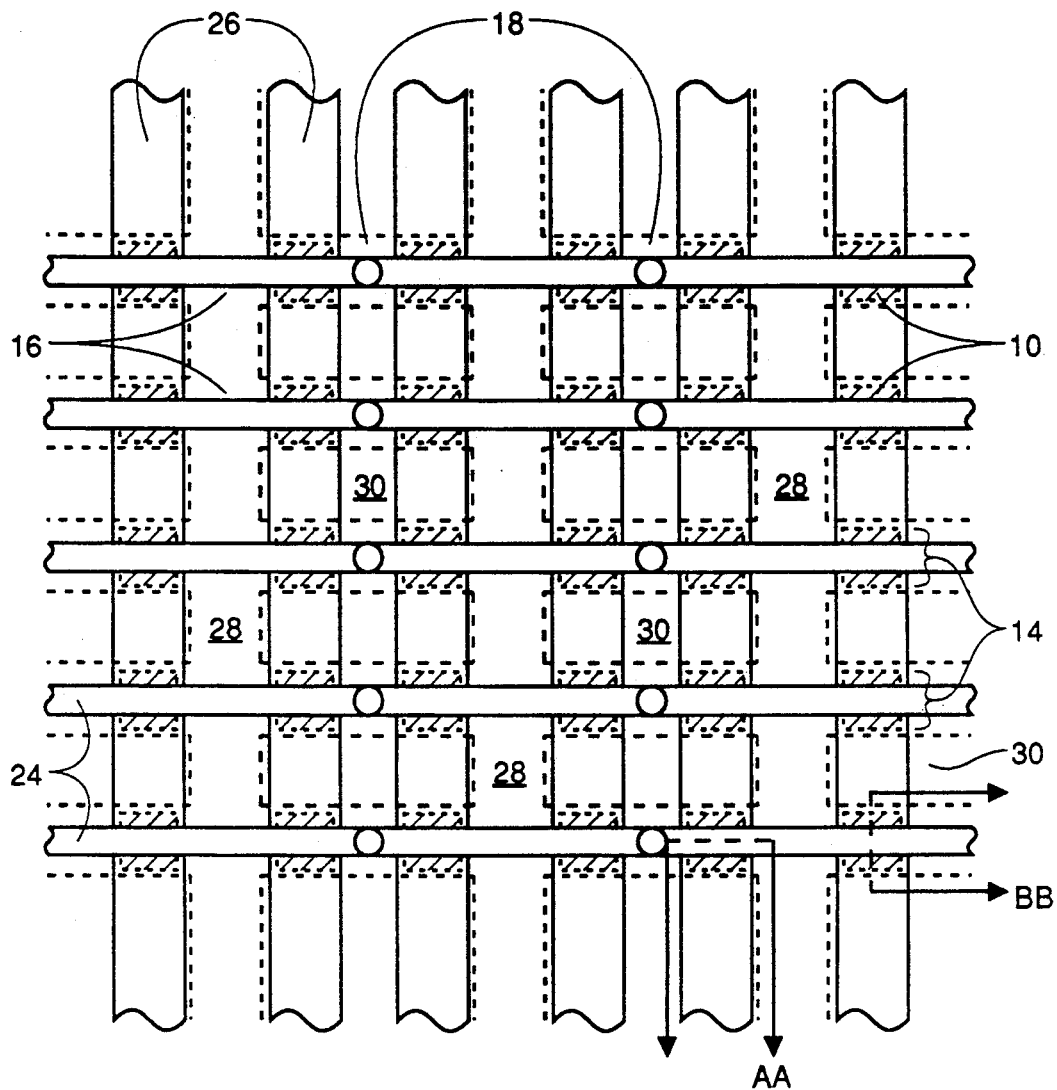
FIG. 1 is a top view of a PROM array.
Figure 2:
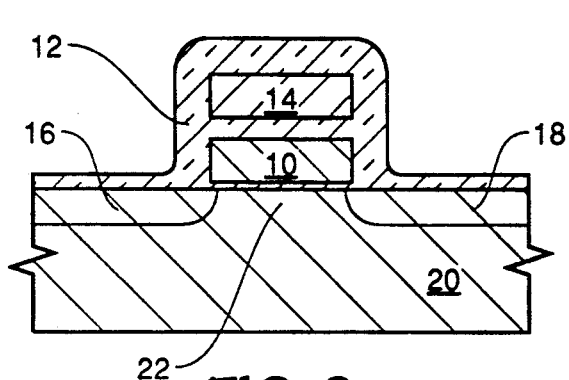
FIG. 2 is a cross section of the FIG. 1 PROM array along "AA"
Figure 3:
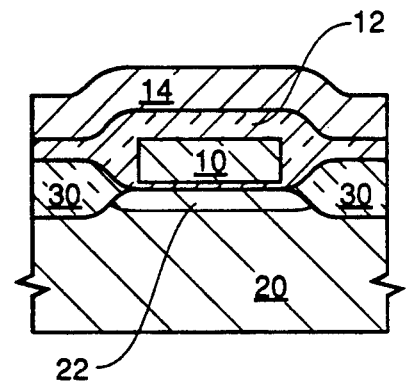
FIG. 3 is a cross section of the FIG. 1 PROM array along "BB"

FIGS. 2 and 3 show cross sections of a Flash E²PROM design. Contrary to prior art Flash E²PROM designs, there is no $V_T$ adjust implant of boron or other P-type dopants performed to the substrate 20 of the Flash E²PROM cell.

To form an inventive structure, a substrate of semiconductor material 20 is formed in accordance to teachings in the art having a P-type conductivity with N+ junctions therein forming source 16 and drain 18 regions. After these areas of the substrate are formed, a blanket layer of P-type poly is deposited on the surface of the substrate and etched to form rows of P1 material. An insulative layer or layers of material such as oxide or oxide-nitride-oxide (ONO) is formed over the P1 rows, and a blanket layer of N-type poly is deposited on the surface. An etch to the substrate forms columns of P2 material 14, while also etching the rows of P1 material into isolated floating gates 10. Wafer processing continues according to teachings in the art, for instance to form spacers, contacts, etc.

The threshold voltage is affected by several factors, and can be described by the equation:

$$V_T = V_{FB} + 2\phi_f + SQRT(2\epsilon_S\epsilon_0 q N_A(2\phi_f + V_{BG}))/C_0$$

where $$V_{FB} = \phi_{ms} - Q_f/C_0$$

"$V_{FB}$" is the flat-band voltage and "$2\phi_f$" is unrelated to the invention. The third term "SQRT(2 . . . ))/$C_0$" includes factors such as the channel doping profile "$N_A$", which is affected by the inventive process, and other factors unrelated to the invention herein such as temperature, structure thicknesses, etc. The term $\phi_{ms}$ is the work function difference between the P1 structure and the silicon. Using a P1 gate of P-type poly and a conventional P-type substrate in the channel region increases the work function difference, thereby increasing $V_T$.

Omitting the $V_T$ adjust implant decreases the flat-band voltage, thereby lowering $V_T$, but increases $N_A$ thereby making the $V_T$ larger. Since the contribution of the work function difference between the P-type floating gate and the N-type control gate is greater than the lowering of $V_T$ from omitting the boron implant, the net effect is a raising of $V_T$. There is a possibility that $V_T$ could be increased beyond a desired value in the inventive cell.

To adjust $V_T$ in this case, an N-type implant of a material such as phosphorous into the channel would lower the $V_T$ to a desired level and offset the $V_T$ rise due to the work function difference. The use of a phosphorous enhancement implant for the Flash E²PROM NMOS would form a "buried channel device" which are known to have improved erase characteristics.

Figure 4:
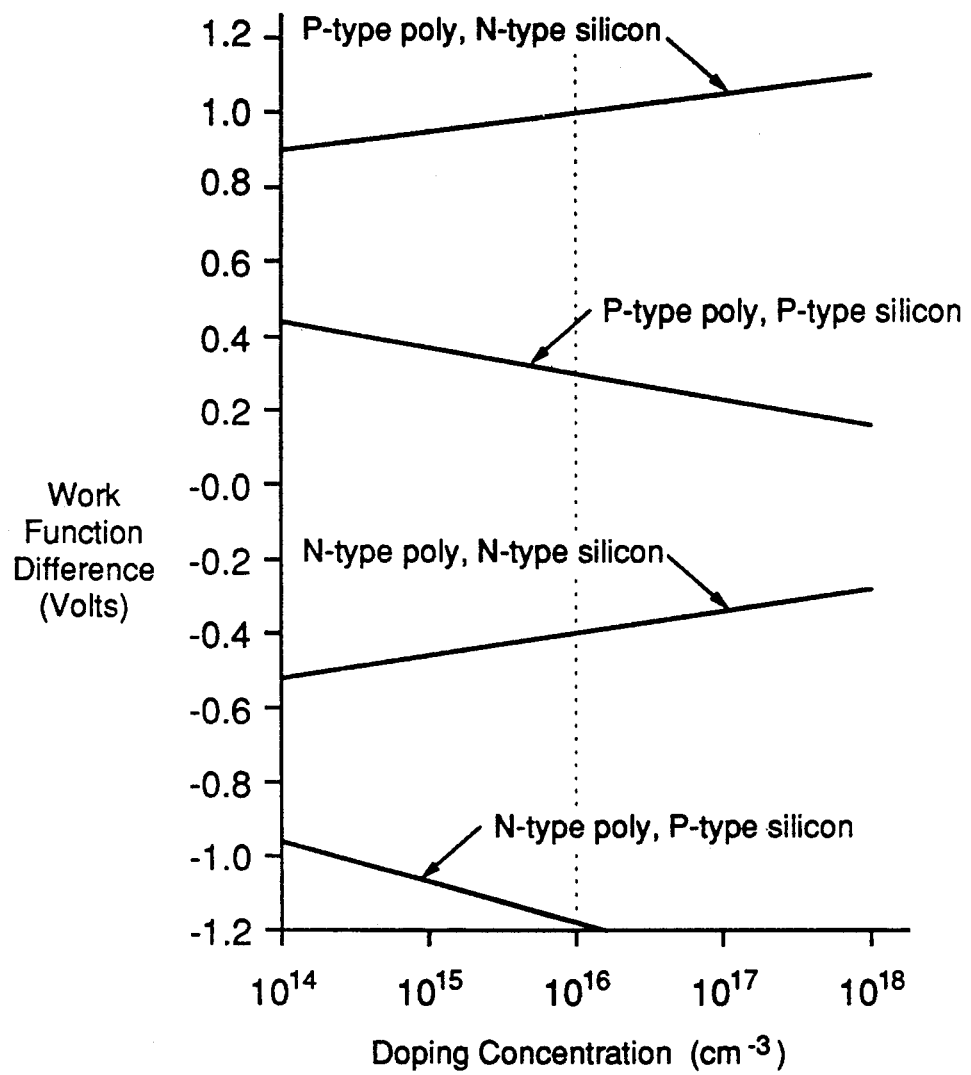
FIG. 4 is a graph showing the work function difference between both a conventional structure (P-type silicon and N-type floating gate) and the inventive structure (P-type silicon and P-type floating gate). The work function differences between other materials for other embodiments are also shown.

The work function differences of several materials are shown in FIG. 4. Shown is the work function difference resulting from a P-type silicon (the channel region of a conventional design) with an N-type poly (the floating gate of a conventional design). Also shown is the work function difference resulting from P-type silicon (the channel) with a P-type poly (the floating gate of an inventive first embodiment). The work function is plotted along the vertical axis in volts, with the doping density plotted along the horizontal axis in $cm^{-3}$. At $10^{16}\ cm^{-3}$, for instance, the work function of N-type poly with P-type silicon, as is used with present designs of Flash E²PROMs, is approximately $-1.1$ V. At the same doping levels, the work function of P-type poly with P-type silicon, as used with the inventive design of a first embodiment, is approximately 0.35 V, 1.45 V higher. By increasing or decreasing the doping density of the floating gate poly, the $V_T$ can be adjusted to desired levels for this standard NMOS device. A floating gate doping density of between $10^{17}\ cm^{-3}$ and $10^{21}\ cm^{-3}$ would be sufficient for use with the inventive device.

FIG. 4 also shows the work function difference of an N-type silicon with an N-type poly. A second embodiment of the invention uses N-type substrate with P-type source and drain wells, and an N-type floating gate. The work function difference between this embodiment and a conventional design is $$-0.4\ V - (-1.1\ V) = 0.7\ V\ \text{difference.}$$

A third embodiment comprises N-type silicon and P-type poly. From FIG. 4 the work function difference between this third embodiment and a conventional design is $$1.0 - (-1.1) = 2.1\ V\ \text{difference.}$$

As the second and third embodiments described herein comprise N-type silicon, and therefore result in PMOS devices, these would have limited but potentially useful applications.

What have been described are specific configurations of the invention, as applied to particular embodiments. Clearly, variations can be made to the original designs described in this document for adapting the invention to other embodiments. In addition, other methods of forming the substrate and gate conductivity types are possible, and other means of forming the P1 and P2 structures are possible and likely. Therefore, the invention should be read as limited only by the appended claims.

I claim:

1. A semiconductor transistor device comprising:
   a) a substrate, said substrate having a transistor source, drain, and channel, said channel comprising a portion having a P-type preinversion conductivity;
   b) a floating gate over said channel for storing a charge, said floating gate having a P-type conductivity; and
   c) a word line over said floating gate, said word line for activating a number of transistors from an array of transistors;
   wherein a work function difference between material comprising said channel and material comprising said floating gate results in a device having a desired threshold voltage without a voltage adjust implant.

2. The semiconductor transistor device of claim 1 wherein said channel is implanted with N-type majority carriers to lower said threshold voltage.

3. The semiconductor transistor device of claim 1 wherein said floating gate is doped polysilicon with an ion concentration between $10^{17}\ cm^{-3}$ and $10^{21}\ cm^{-3}$.

4. A semiconductor transistor device comprising:
   a) a substrate, said substrate having a transistor source, drain, and channel, said channel comprising a portion having an N-type preinversion conductivity;
   b) a floating gate over said channel for storing a charge, said floating gate having a P-type conductivity; and
   c) a word line over said floating gate, said word line for activating a number of transistors from an array of transistors;
   wherein a work function difference between material comprising said channel and material comprising said floating gate results in a device having a desired threshold voltage without a voltage adjust implant.

5. The semiconductor transistor device of claim 4 further comprising P-type majority carriers implanted in said channel to lower a threshold voltage of said semiconductor device.

6. The semiconductor transistor device of claim 4 wherein said floating gate is doped polysilicon with an ion concentration between $10^{17}\ cm^{-3}$ and $10^{21}\ cm^{-3}$.

7. The semiconductor memory device of claim 4, wherein said memory device is an electrically erasable programmable read-only memory device.

8. A semiconductor transistor device comprising:
   a) a substrate, said substrate having a transistor source, drain, and channel, said channel comprising a portion having an N-type preinversion conductivity;
   b) a floating gate over said channel for storing a charge, said floating gate having a N-type conductivity;
   c) a word line over said floating gate, said word line for activating a number of transistors from an array of transistors; and
   d) P-type majority carriers implanted in said channel to lower a threshold voltage of said semiconductor device;
   wherein a work function difference between material comprising said channel and material comprising said floating gate results in a device having a desired threshold voltage without an N-type carrier voltage adjust implant.

9. The semiconductor transistor device of claim 8 wherein said floating gate is doped polysilicon with an ion concentration between $10^{17}\ cm^{-3}$ and $10^{21}\ cm^{-3}$.

10. The semiconductor memory device of claim 8, wherein said memory device is an electrically erasable programmable read-only memory device.

11. The semiconductor memory device of claim 1, wherein said memory device is an electrically erasable programmable read-only memory device.

* * * * *